United States Patent
Furusawa et al.

(10) Patent No.: US 7,356,921 B2
(45) Date of Patent: Apr. 15, 2008

(54) METHOD FOR FORMING A CONDUCTIVE LAYER PATTERN

(75) Inventors: Masahiro Furusawa, Chino (JP); Takashi Hashimoto, Chino (JP)

(73) Assignee: Seiko Epson Corporation (JP)

( * ) Notice: Subject to any disclaimer, the term of this patent is extended or adjusted under 35 U.S.C. 154(b) by 309 days.

(21) Appl. No.: 10/414,461

(22) Filed: Apr. 15, 2003

(65) Prior Publication Data

US 2003/0213614 A1 Nov. 20, 2003

(30) Foreign Application Priority Data

| Apr. 15, 2002 | (JP) | ............................. 2002-112060 |
| Aug. 19, 2002 | (JP) | ............................. 2002-238390 |

(51) Int. Cl.
*H05K 3/02* (2006.01)
*H05K 3/10* (2006.01)

(52) U.S. Cl. ............................. 29/846; 29/829; 29/830; 174/257; 427/98.5; 427/466

(58) Field of Classification Search ................... 29/825, 29/829–831, 846; 174/255–257; 427/96.1, 427/97.1, 97.3, 98.9, 98.4–98.6, 466; 428/32.32, 428/32.34–32.37, 32.33; 430/321; 438/674, 438/584; 347/65; 361/779
See application file for complete search history.

(56) References Cited

U.S. PATENT DOCUMENTS

| 4,893,404 | A | * | 1/1990 | Shirahata et al. ............. 29/852 |
| 5,114,744 | A | * | 5/1992 | Cloutier et al. ............ 427/97.4 |
| 5,460,921 | A | | 10/1995 | Cywar et al. ................ 430/314 |
| 5,480,839 | A | | 1/1996 | Ezawa et al. |
| 5,851,732 | A | * | 12/1998 | Kanda et al. ................ 430/321 |
| 5,965,252 | A | * | 10/1999 | Santo et al. ............. 428/32.36 |
| 6,464,345 | B2 | * | 10/2002 | Kubota et al. ................. 347/65 |
| 6,503,831 | B2 | * | 1/2003 | Speakman ................... 438/674 |
| 6,599,582 | B2 | * | 7/2003 | Kiguchi et al. ............. 427/466 |
| 6,810,814 | B2 | * | 11/2004 | Hasei .......................... 361/779 |
| 2006/0068573 | A1 | * | 3/2006 | Shintate et al. ............. 438/584 |

FOREIGN PATENT DOCUMENTS

| CN | 1126369 | 7/1996 |
| EP | 0 930 641 A2 | 1/1999 |
| JP | 11-274681 | 10/1999 |
| JP | 11-317157 | 11/1999 |
| JP | 2001-345537 | 12/2001 |
| JP | 2002-211112 | 7/2002 |

OTHER PUBLICATIONS

Communication from Chinese Patent Office re: counterpart application (and translation).

* cited by examiner

*Primary Examiner*—Minh Trinh
*Assistant Examiner*—Donghai D. Nguyen
(74) *Attorney, Agent, or Firm*—Harness, Dickey & Pierce, P.L.C.

(57) ABSTRACT

A method for forming a conductive layer pattern by selectively depositing droplets containing conductive material onto a porous receiving layer. Much of the conductive material is left on the surface for forming wiring patterns but some of it permeates the pockets or voids in the receiving layer and can be used, for example, to provide interlayer connections in laminated wiring boards. Preferably, the conductive material is provided by fine conductive particles, organometallic compounds or mixtures thereof.

15 Claims, 7 Drawing Sheets

(a)

(b)

(a)

(b)

(c)

(a)

(b)

(c)

METHOD FOR FORMING A CONDUCTIVE LAYER PATTERN

TECHNICAL FIELD OF THE INVENTION

The invention relates to a conductive layer pattern and a method for forming the same, a wiring board, an electronic device, electronic appliances, and a noncontact card medium.

DESCRIPTION OF THE RELATED ART

A lithographic method has been used for producing wiring boards for use in electronic circuits or integrated circuits. Wiring lines are formed in the lithographic method by applying a photosensitive material called a resist on a substrate on which a conductive layer has been applied in advance, developing a circuit pattern by irradiating a light, and etching the conductive layer depending on the resist patterns. However, large facilities such as a vacuum apparatus and a complicated process are required for the lithographic method. Moreover, the production cost has been high since most of the resist material is forced to be discarded with a material efficiency of only several percent.

In contrast, U.S. Pat. No. 5,132,248 proposes a method in which a solution containing dispersed conductive fine particles is directly applied on a substrate to form a pattern, and the pattern is converted into a pattern of a conductive layer by heat treatment or laser irradiation. This method is advantageous in that no lithographic process is required to largely simplify the patterning process while reducing the amount of use of starting materials.

Meanwhile, the width (line width) of the conductive pattern obtained should be restricted within a required size when the conductive pattern is used for wiring. In the methods devised for restricting the line width within a desired size, a liquidphile pattern and a liquid repelling pattern are formed on the substrate, and droplets are discharged by an ink-jet method so as to be disposed only on the liquidphile portions; or the droplets are discharged on a liquid repelling substrate so that the line width is prevented from spreading, and overlap between adjoining droplets is controlled so that swelling of the droplets called bulges are not generated.

However, a conductive pattern with a thickness of only about 1 μm is formed by one stroke of application of the pattern using the methods above. Accordingly, several times of pattern application should be repeated with intervention of drying steps between the pattern application steps when larger thickness of the layer is needed.

A long period of time is required for alternately repeating the pattern application step and drying step as described above, which is a disadvantageous process to result in poor productivity.

Accordingly, an object of the invention considering the situations above is to provide a conductive layer pattern and a method for forming the conductive layer pattern capable of more efficiently forming a thick layer by improving the method for forming the conductive layer pattern. Another object of the invention is to provide a substrate, an electronic device, electronic appliances and a noncontact card medium using the conductive layer pattern.

SUMMARY OF THE INVENTION

The invention provides a conductive layer pattern comprising a receiving layer of a fine void type provided above a wiring board, wherein at least one of conductive fine particles and organometallic compounds, or the conductive fine particles and organometallic compounds are bonded with each other on the receiving layer, or on the receiving layer and in the receiving layer.

A fluid containing at least one of the conductive particles and organometallic compounds is provided on the receiving layer, or on the receiving layer and in the receiving layer by, for example, a droplet discharge method in the process for producing the conductive pattern. Then, liquid components in the fluid permeate into the receiving layer to mainly leave at least one of the fine conductive particles and organometallic compounds behind on the receiving layer. Consequently, repeated application is possible without any drying treatments to enable thick layers to be efficiently formed.

Preferably, the receiving layer is a porous layer containing at least one of porous silica, alumina and alumina hydrate particles, and a binder in the conductive layer pattern.

Since the porous layer containing at least one of the porous silica, alumina and alumina hydrate particles promptly absorbs the liquid component in the fine voids formed among the particles, at least one of the conductive fine particles and organometallic compounds are selectively left behind on the receiving layer comprising the porous layer.

Preferably, the receiving layer comprises a plurality of layers different in materials or structures with each other in the conductive layer pattern.

Since a layer for permeating only the liquid component in the fluid and a layer for absorbing the liquid component may be independently formed by the method above, the liquid component are efficiently eliminated.

Preferably, the thickness of the receiving layer is 1 μm or less in the conductive layer pattern.

Incidence of break of the wiring lines is reduced in the process for baking the conductive fine particles and organometallic compounds while making it easy to electrically communicate upper and lower wiring lines through the receiving layer by forming the receiving layer with the thickness above when the wiring lines are formed as a multilayer.

The invention provides a method for forming a conductive layer pattern comprising the steps of: forming a receiving layer of a fine void type above a substrate; providing a fluid containing at least one of fine conductive particles and organometallic compounds on the receiving layer, or on the receiving layer and in the receiving layer; and forming a conductive pattern by allowing at least one of the conductive fine particles and organometallic compounds to contact with each other, or by allowing the conductive fine particles and organometallic compounds to contact with each other.

When the conductive layer pattern is formed by the method as described above, the fluid containing at least one of the conductive fine particles and organometallic compounds is provided on the receiving layer, or on the receiving layer and in the receiving layer. Consequently, the liquid component of the fluid permeates into the receiving layer while leaving at least one of the conductive fine particles and organometallic compounds behind on the receiving layer. Therefore, the fluid may be repeatedly applied without drying treatment, and the coating layer is efficiently thickened.

Preferably, the step for forming the receiving layer comprises the step of forming a plurality of layers different in materials or structures with each other in the method for forming the conductive layer pattern.

The liquid component may be efficiently eliminated by the method above since the layer for allowing the liquid component to permeate and the layer for absorbing the liquid component can be independently formed.

Preferably, the method for forming the conductive layer pattern comprises the step of applying a surface treatment so that the surface of the receiving layer is repellent to the fluid after the step for forming the receiving layer and before the step for providing the fluid.

A finer conductive layer pattern may be formed by the method as described above, since the fluid is prevented from being spread before being absorbed into the receiving layer.

Preferably, the receiving layer is formed by applying a mixture of at least one of porous silica, alumina and alumina hydrate particles, and a binder in the method for forming the conductive layer pattern.

Since the liquid component is promptly absorbed into the fine voids formed among the particles of the porous layer containing at least one of porous silica, alumina and alumina hydrate particles, at least one of the conductive fine particles and organometallic compounds are selectively left behind on the receiving layer comprising the porous layer.

Preferably, a droplet discharge method is used in the step for providing the fluid on the receiving layer, or on the receiving layer and in the receiving layer in the method for forming the conductive layer pattern. The fluid is discharged by the droplet discharge method so that the droplets after hitting the wiring board are in contact with each other.

The liquid component in the fluid permeates into the receiving layer as described above, and at least one of the conductive fine particles and organometallic compounds are left behind on the receiving layer. Consequently, the fluid may be partially and repeatedly applied by merely discharging so that droplets after hitting the substrate are in contact with each other.

Preferably, plural times of the application steps are repeated in the step for providing the fluid on the receiving layer, or on the receiving layer and in the receiving layer in the method for forming the conductive layer pattern.

At least one of the conductive fine particles and organometallic compounds are selectively left behind on the receiving layer with substantially no liquid component therein by the method as described above. Accordingly, the fluid may be directly and repeatedly applied without employing drying steps, and the conductive layer pattern can be more efficiently thickened.

Preferably, the method for forming the conductive layer pattern comprises a heat treatment step at a temperature where at least one of the conductive materials and organometallic compounds, or the conductive fine particles and organometallic compounds are not bonded with each other while repeating the steps for providing the fluid on the receiving layer, or on the receiving layer and in the receiving layer.

The liquid component in the fluid on the receiving layer may be more promptly transferred into the receiving layer, or may be eliminated from the receiving layer by evaporation. In addition, a part of the liquid component that has been transferred into the receiving layer may be also eliminated from the receiving layer by evaporation.

The wiring board of the invention comprises the conductive layer pattern as described above, or the conductive layer pattern formed by the method as described above as wiring lines.

A high quality wiring board may be obtained with high productivity by efficiently thickening the conductive layer pattern as described above.

Preferably, a plurality of wiring lines comprising the receiving layer and conductive layer pattern formed on and in the receiving layer are laminated with interposition of conductive posts connected to the wiring lines and insulation layers.

A part of at least one of the conductive fine particles and organometallic compounds permeate into fine voids at just under the conductive pattern in the receiving layer by forming the conductive pattern comprising at least one of the conductive fine particles and organometallic compounds on the receiving layer, and the position just under the conductive pattern becomes conductive. Consequently, wiring lines comprising the conductive layer pattern provided on and under the insulation layer electrically communicate with each other through the position just under the conductive pattern and conductive posts. Therefore, the substrate serves as a multilayer substrate.

Preferably, the insulation layer is formed by baking the receiving layer of a fine void type.

The receiving layer of a fine void type loses its function as the receiving layer by baking, and only functions as an insulation layer. Accordingly, preparation of another insulation layer material is not needed to enable the multilayer wiring board to be efficiently formed.

Preferably, the conductive post comprises: a conductive pattern formed by bonding at least one of the conductive fine particles and organometallic compounds with each other, or by bonding the conductive fine particles and organometallic compounds with each other, on the receiving layer of the fine void type; and a conductive pattern formed by bonding at least one of the conductive fine particles and organometallic compounds with each other, or by bonding the conductive fine particles and organometallic compounds with each other, in the receiving layer of the fine void type in the wiring board.

Since the conductive post and insulation layer can be simultaneously formed by the method above, the multilayer wiring board is more efficiently formed.

The electronic device of the invention comprises the conductive layer pattern described above, or the conductive layer pattern formed by the method as described above, as wiring lines.

High quality electronic device may be obtained with high productivity by efficiently thickening the conductive layer pattern as described above.

The electronic appliances of the invention comprises the conductive layer pattern as described above, or the conductive layer pattern formed by the method as described above, as wiring lines.

High quality electronic appliances may be obtained with high productivity by efficiently thickening the conductive layer pattern as described above.

The noncontact card medium of the invention comprises the conductive layer pattern as described above, or the conductive layer pattern formed by the method as described above, as an antenna circuit.

A high quality noncontact card medium may be obtained with high productivity by efficiently thickening the conductive layer pattern as described above.

BRIEF DESCRIPTION OF THE DRAWINGS

shows a perspective view of the main part, and FIG. 2(b) shows a cross section of the main part.

FIG. 5 show electronic appliances of the invention, wherein FIG. 5(a) shows an example of a portable phone, FIG. 5(b) shows an example of a portable information processor, and FIG. 5(c) shows an example of a watch type electronic appliances.

DESCRIPTION OF THE PREFERRED EMBODIMENTS

The invention will be described in more detail hereinafter.

The production method of the invention comprises the steps of: forming a receiving layer of a fine void type above the substrate; providing a fluid containing at least one of conductive fine particles and organometallic compounds on the receiving layer, or on the receiving layer and in the receiving layer, of the wiring board by a droplet discharge method; and allowing at least one of the conductive fine particles and organometallic compounds to contact with each other, or the conductive fine particles and organometallic compounds to contact with each other, by heat treating the fluid on the receiving layer, or on the receiving layer and in the receiving layer, in order to form a conductive pattern comprising at least one of the conductive fine particles and organometallic compounds.

Figure 1:
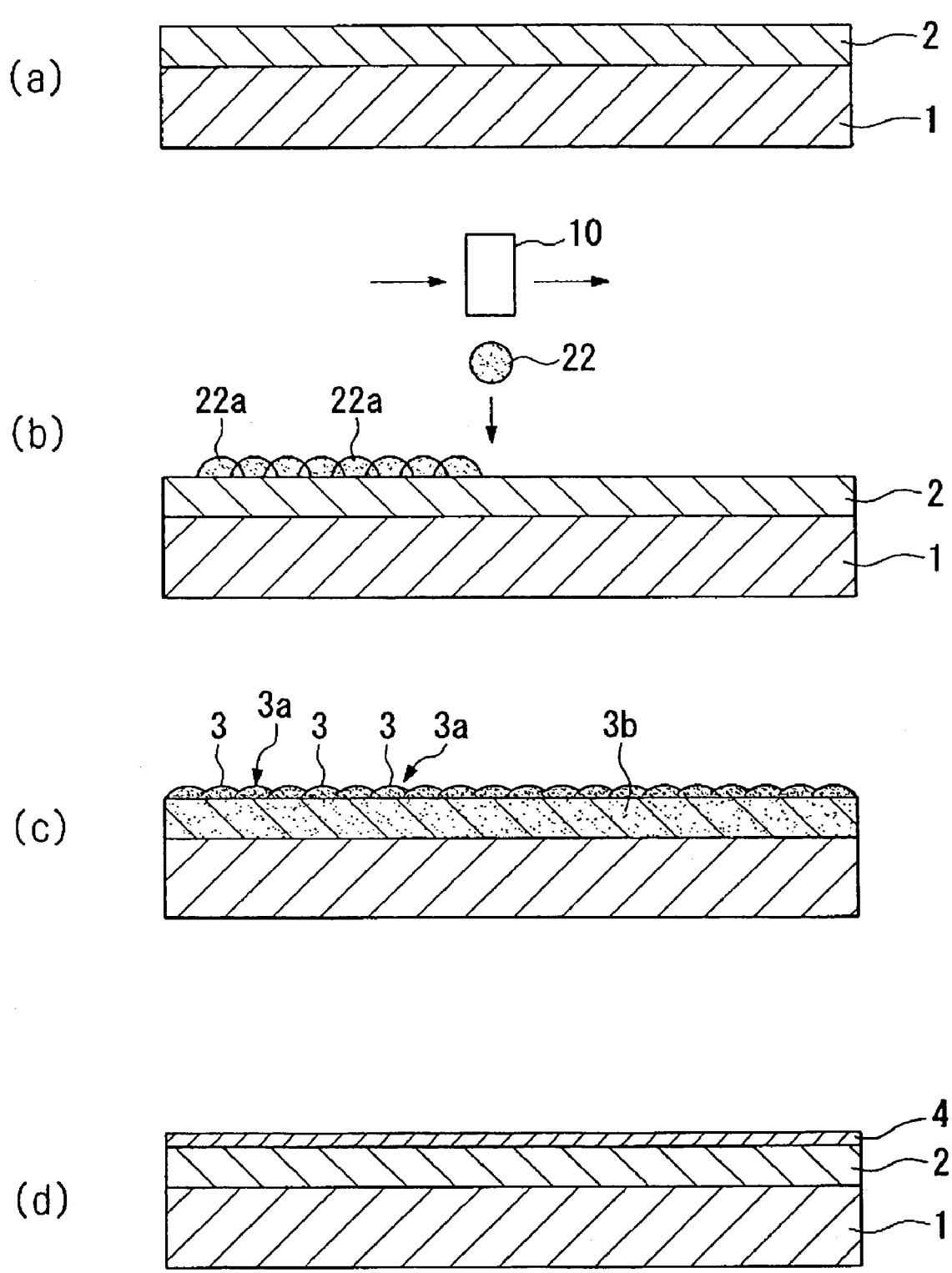
FIGS. 1(a) to 1(d) show cross sections of the main part for sequentially describing the method for forming the conductive layer pattern of the invention.

As shown in FIG. 1(a), the receiving layer 2 of a fine void type (i.e., having minute holes or pockets therein) is formed on the wiring board 1. An appropriate wiring board 1 is selected depending on the use of the conductive pattern. For example, the material of the substrate is appropriately selected depending on use such that silicon is used for a semiconductor device (an electronic device), a glass is used for an electrooptical device (electronic device) such as a liquid crystal display, organic EL display and plasma display, and polyimide is used as a multilayer wiring board. Various layers such as insulation layers, and constituting elements such as a thin film transistor may be formed on the wiring board 1.

The receiving layer 2 is preferably formed by applying at least one of porous silica, alumina and alumina hydrate particles and a binder, and is desirably formed by applying a mixture of at least one of the alumina and alumina hydrate particles, porous silica particles and binder.

The porous silica particles preferably have a mean particle diameter of 2 to 50 μm, a mean fine void diameter of 8 to 50 nm, and a fine void volume of 0.8 to 2.5 cc/g. The porous silica particles may contain 20% by weight or less of boria, magnesia, zirconia and titania.

Examples of alumina or alumina hydrate include porous aluminum oxide and hydrates thereof having a sum of the fine void volume with a void radius of 3 to 10 nm of 0.2 to 1.5 cc/g. The distribution of the fine void contained in the alumina oxide or alumina hydrate can be measured by a nitrogen absorption method (constant flow method) using, for example, Omnisorb 100 made by Omicron Technology Co. More preferably, the sum of the fine void volume having a void radius of 3 to 10 nm is 0.2 to 1.5 cc/g.

Alumina or alumina hydrate may be crystalline or amorphous, and the form thereof may be either irregular particles or spherical particles. A gel substance obtained by drying an alumina sol is particularly favorable.

An example of such substance is pseudo-boehmite that is most suitable as the substance to be used in the invention. Pseudo-boehmite obtained by drying a sol is particularly preferable.

The amount of use of alumina or alumina hydrate is preferably 5 to 50% by weight relative to the amount of the porous silica particles.

While polyvinyl alcohol is favorably used as the binder to be mixed with such porous silica particles and/or alumina or alumina hydrate particles, various modified polyvinyl alcohol such as cation modified, anon modified and silanol modified polyvinyl alcohol, starch derivatives and modified starch derivatives, cellulose derivatives and styrene-maleic acid copolymer may be also used alone or as a mixture thereof.

Various application methods using an air-knife coater, blade coater, bar-coater, rod coater, roll coater and photogravure coater, and size press, spin coat, droplet discharge and screen printing methods may be used for applying the mixture above.

After applying a mixture of the porous silica particles and/or alumina or alumina hydrate particles, and the binder on the wiring board 1, the substrate is subjected to a drying treatment in order to evaporate the liquid component in the mixture and solidify the binder. Such dry-treatment methods available include heating at a temperature where the silica particles and alumina particles are not sintered, for example 50 to 130° C., treating in a reduced pressure, and using the heating treatment and reduced pressure treatment together. A porous layer having fine voids among the particles such as the porous silica particles or alumina or alumina hydrate particles constituting the receiving layer 2 is formed by employing the drying treatment as described above.

The porous layer of the fine void type formed as described above may comprise a plurality of layers being different in the materials and structures. For example, after forming a porous layer by application and drying of a mixture of the porous silica particles and alumina or alumina hydrate particles and a binder, another mixture of the porous silica particles and alumina particles is applied followed by drying, thereby forming a receiving layer comprising the plural layers being different in their materials.

While the thickness of the receiving layer used in an in-jet printing method is usually about 10 μm to 100 μm, a layer having a smaller thickness is preferable for forming the conductive pattern. A receiving layer with a thickness of 1 μm or less can be formed by applying a mixture of at least one of alumina and alumina hydrate and a binder after further diluting with a solvent, or by applying by the spin-coat method.

The receiving layer may be selectively applied on required portions, if necessary, for forming the receiving layer, in place of applying on the entire surface of the substrate. For example, screen printing method and droplet discharge method my be employed for this purpose. The unnecessary portions may be removed by resist coating, exposure, development and etching after applying the receiving layer on the entire surface of the substrate.

The surface of the receiving layer formed as described above may be subjected to a surface treatment that renders the surface repellent to the fluid to be disposed thereon. An example of the fluid repellent treatment is to form a single molecular layer of fluoroalkyl silane. For forming such single molecular layer, for example, the surface of the receiving layer on a 4 inch square substrate is cleaned by irradiating a UV light having an energy of 10 mW/cm$^2$ with a wavelength of 254 nm for 10 minutes. Then, the substrate and 0.1 g of perfluoro-1,1,2,2-tetrahydrodecyl triethoxysilane is placed in a sealed vessel with a volume of 10 liter followed by a heat treatment at 120° C. for 2 hours. Such fluid repellent treatment can prevent the liquid component of the fluid from being broadened before being absorbed into the receiving layer.

Subsequently, the fluid containing at least one of the conductive fine particles and organometallic compounds is provided on the receiving layer 2 of the wiring board 1 by the droplet discharge method as shown in FIG. 1(b).

A dispersion of the conductive fine particles in a dispersing solvent, a liquid organometallic compound, a solution of an organometallic compound, or a mixture thereof is used as the fluid containing at least one of the conductive fine particles and organometallic compound. The conductive fine particles to be used herein include fine particles of a metal containing either gold, silver, copper, palladium or nickel, and fine particles of a conductive polymer or superconductive material.

These conductive fine particles may be used by coating the surface thereof with an organic substance for improving dispersion ability. Examples of the coating agent for coating the surface of the conductive fine particles include an organic solvent such as xylene and toluene, and citric acid.

The particle diameter of the conductive fine particles is preferably 1 nm or more and 0.1 μm or less. The nozzle of the head of the droplet discharge apparatus may be readily clogged to make it difficult to discharge by the droplet discharge method, unless the particle diameter is smaller than 0.1 μm. On the other hand, the volume ratio of the coating agent to the conductive fine particles becomes so large that the proportion of the organic substance in the layer obtained increases, unless the diameter is larger than 1 nm.

The organometallic compound includes a compound or complex containing gold, silver and palladium that precipitates a metal by heat decomposition. Examples thereof include chlorotriethylphosphine gold (I), chlorotrimethylphosphine gold (I), silver (I) 2,4-pentanedithioanto complex, trimethylphosphine (hexafluoroacetylacetonato)silver (I) complex, and copper (I) hexafluoropentaneditionato cyclooctadiene complex.

The dispersing medium or solvent containing at least one of the conductive fine particles and organometallic compound preferably has a vapor pressure of 0.001 mmHg or more and 200 mmHg or less (about 0.133 Pa or more and 26,600 Pa or less) at room temperature. A good layer cannot be formed due to rapid evaporation of the dispersing medium or solvent, when the vapor pressure is higher than 200 mmHg.

The vapor pressure of the dispersing medium or solvent is more preferably 0.001 mmHg or more and 50 mmHg or less (about 0.133 Pa or more and 6,650 Pa or less). Stable discharge becomes difficult when the vapor pressure is higher than 50 mmHg, since the nozzle is readily clogged when discharging the droplets by the droplet discharge method.

On the other hand, the dispersing medium or solvent is liable to be left behind in the layer due to slow drying when the vapor pressure of the dispersing medium or solvent at room temperature is lower than 0.001 mmHg, and a god quality conductive layer cannot be obtained after a heat and/or light treatment in the steps thereafter.

The dispersing medium used is not particularly restricted so long as it is able to disperse the conductive fine particles. The solvent is also not particularly restricted so long as it can dissolve the organometallic compound. Examples of the dispersing medium or solvent include, other than water, alcohols such as methanol, ethanol, propanol and butanol; hydrocarbon compounds such as n-heptane, n-octane, decane, toluene, xylene, methin, dulene, indene, dipentene, tetrahydronaphthalene, decahydronaphthalene and cyclohexyl benzene; ether compounds such as ethyleneglycol dimethylether, ethyleneglycol diethylether, ethyleneglycol methylethylether, diethyleneglycol dimethylether, diethyleneglycol diethylether, diethyleneglycol methylethylether, 1,2-dimethoxyethane, bis(2-methoxyethyl)ether and p-dioxane; and polar compounds such as propylene carbonate, γ-butylolactone, N-methyl-2-pyrroridone, dimethylformamide, dimethyl sulfoxide and cyclohexanone. Water, alcohols, hydrocarbon compounds and ether compounds are preferable among them considering dispersion ability of the fine particles and stability of the dispersion, and easy applicability of the droplet discharge method. Examples of the more preferable dispersing medium or solvent are water and hydrocarbon compounds. These dispersing media or solvents may be used alone, or as a mixture of at least two of them.

The concentration of the dispersed substance when the conductive fine particles are dispersed in the dispersing medium is preferably 1% by mass or more and 80% by mass or more, and the concentration may be adjusted depending on the desired thickness of the conductive layer. A uniform layer can be hardly obtained due to coagulation when the concentration exceeds 80% by mass. The concentration of the solute in the solution of the organometallic compound is preferably within the same range by the same reasons as described above.

The surface tension of the liquid containing at least one of the conductive fine particles and organometallic compound prepared as described above is preferably 0.02 N/m or more and 0.07 N/m or less. The droplets tend to fly along curved routes due to increased wettability of the ink composition to the nozzle face when the surface tension is less than 0.02 N/m when the liquid is discharged by the droplet discharge method. On the other hand, control of the discharge volume and discharge timing become difficult when the surface tension exceeds 0.07 N/m due to unstable shape of the meniscus at the tip of the nozzle.

A small amount of a fluorine, silicone or nonionic surface tension controlling agent may be added to the liquid for adjusting the surface tension in a range not causing undue decrease of the contact angle with the receiving layer. The nonionic surface tension controlling agent is useful for improving wettability of the liquid to the substrate, for improving leveling of the layer, and for preventing spotty or wrinkled coating layer from being formed.

The liquid may contain other organic compounds such as alcohols, ethers, esters and ketones, if necessary.

The viscosity of the liquid is preferably 1 mPa·s or more and 50 mPa·s or less. The peripheral portion of the nozzle is tend to be contaminated by the spilt ink during discharge by the droplet discharge method when the viscosity is smaller than 1 mPa·s. On the other hand, smooth discharge of the droplet becomes difficult due to high incidence of clogging of the nozzle holes when the viscosity is larger than 50 mPa·s.

Figure 2:
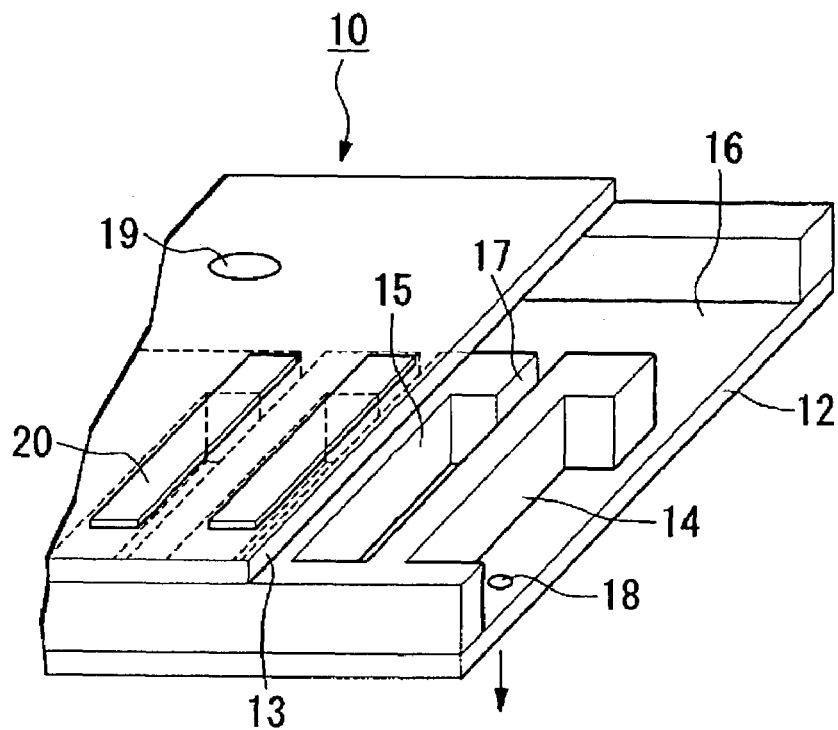
FIG. 2 is provided for schematically describing the construction of the droplet discharge head, wherein FIG. 2(a)
Figure 2:
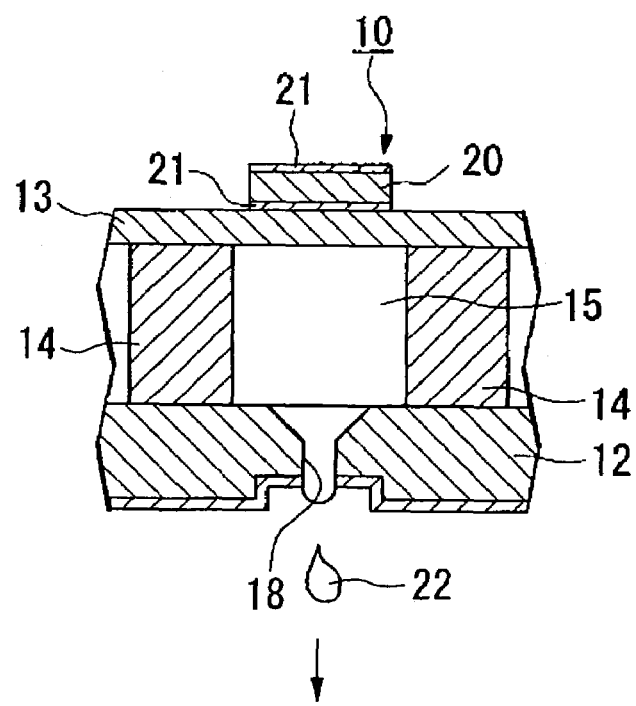

An apparatus provided with the droplet discharge head 10 shown in FIGS. 2(a) and 2(b) is favorably used as the droplet discharge apparatus for discharging the fluid containing at least one of the conductive fine particles and organometallic compound.

The droplet discharge head 10 comprises a nozzle plate 12 made of stainless steel and a vibration plate 13, and they are bonded with interposition of a partition member (reservoir plate) 14. A plurality of spaces and 15 and liquid pool 16 are formed with the partition members 14 between the nozzle plate 12 and vibration plate 13. The inside of each space 15 and liquid pool 16 is filled with an ink, and each space 15 communicates the liquid pool 16 through a feed port 17. A plurality of nozzle holes 18 for spraying the ink from the space 15 are formed as a straight line in the nozzle plate 12. An opening 19 for supplying the ink to the liquid pool 16 is provided on the vibration plate 13.

A piezoelectric element (piezo-element) 20 is bonded at the opposed face side to facing the space 15 of the vibration plate 13. The piezoelectric element 20 is positioned between a pair of electrodes 21, and is bent so as to protrude to the outward by flowing an electric current. The vibration plate 13 bonded to the piezoelectric element 20 with the constitution as described above is also bent to the outward by being integrated with the piezoelectric element 20, thereby increasing the volume of the space 15. Consequently, a fraction of the ink corresponding to the increased volume in the space 15 flows therein from the liquid pool 16 through the feed port 17. When the electric current to the piezoelectric element 20 is stopped in the state as described above, the piezoelectric element 20 and vibration plate 13 returns to respective original shapes. As a result, the droplets 22 of the ink is discharged from the nozzle hole 18 to the substrate by the increase of the ink pressure within the space 15 since the space 15 also resumes its original volume.

Other methods known in the art may be employed as the droplet discharge method (ink-jet method) of the droplet discharge head 10, in addition to the piezoelectric jet method using the piezoelectric element 20.

The droplets 22 of the fluid are discharged as a desired pattern, for example as a pattern of the wiring line to be formed, at a desired position on the receiving layer 2 as shown in FIG. 1(b) using the droplet discharge head 10 having the construction as described above. The fluid is discharged from the droplet discharge head 10 so that each of the droplets 22a after hitting the wiring board contacts neighboring droplets 22a with each other, although discharge of the droplets are not restricted thereto.

The liquid components in the applied fluid (the dispersing medium, liquid organometallic compound and the solution of the organometallic compound) permeate into the fine voids formed in the receiving layer 2 when the fluid is applied on the receiving layer 2 by discharging as described above. As a result, the conductive fine particles 3 in the fluid are left behind on the receiving layer 2 as segments or aggregates (blocks) as shown in FIG. 1(c). The organometallic compound not absorbed in the receiving layer 2 is also left on the receiving layer 2 behind when the fluid contains the organometallic compound. Since the droplets are discharged from the droplet discharge head 10 shown in FIG. 1(b) so that each of the droplets 22a after hitting the wiring board contact neighboring droplets 22a with each other, each aggregate 3a (may contain the organometallic compound) of the conductive fine particles 3 left behind on the receiving layer 2 also contacts the adjoining aggregate. Consequently, all the aggregates 3a form a desired continuous pattern, for example a pattern of the wiring line to be formed.

However, the particles having smaller diameter among the conductive fine particles 3 contained in the fluid may invade or permeate into the fine voids of the receiving layer 2 together with the liquid components such as the dispersing medium and solvent.

After forming a pattern mainly comprising the aggregates 3a of the conductive fine particles 3 on the receiving layer 2 by discharging the droplets 22 as described above, the substrate is subjected to a heat treatment in order to allow the conductive fine particles 3, or the aggregates 3a, remaining on the receiving layer 2 to contact with each other by sintering. Consequently, a conductive pattern 4 comprising sintered conductive fine particles 3, or the pattern 4 as an example of the conductive layer pattern of the invention, is formed as shown in FIG. 1(d). When the fluid contains the organometallic compound, the conductive pattern 4 mainly comprising a metal is formed by decomposition by heat treatment. When the fluid contains the conductive fine particles and organometallic compound, on the other hand, the conductive pattern 4 is formed by a mixture thereof.

The dispersing medium is sufficiently removed from the conductive pattern 4 obtained by the heat treatment, and the organometallic compound is completely decomposed. A coating agent applied on the surface of the conductive fine particles 3 for improving dispersing ability is also sufficiently removed.

The dispersing medium or solvent permeated into the fine voids in the receiving layer 3 is also removed, the conductive fine particles 3b invaded into the fine voids are sintered, and the organometallic compound invaded into the fine voids is decomposed. Simultaneously, most of the binder added for forming the receiving layer 2 is decomposed (burnt up). On the other hand, the particles constituting the receiving layer 2 is sintered. Consequently, the portions where at least one of the conductive fine particles 3b and organometallic compound are not invaded into the fine voids (i.e., where the droplets are not discharged) serve as insulation areas, while the portions where at least one of the conductive fine particles 3b and organometallic compound are invaded into the fine voids (i.e., where the droplets are discharged) serve as conductive parts, although this sub-area has a relatively high resistance.

While the substrate is usually heat treated, or sintered, in the air, it may be sintered in an inert gas atmosphere such as a nitrogen, argon or helium atmosphere. The heat treatment temperature is appropriately determined considering the boiling point (vapor pressure) of the dispersing medium or solvent, the kind and pressure of the gas in the atmosphere, dispersing ability and thermal behavior such as oxidation of the fine particles, decomposition temperature of the organometallic compound, presence and amount of the coating agent, and heat resistant temperature of the substrate. For example, a sintering temperature of about 300° C. is necessary for removing the coating agent containing organic substances. The sintering temperature is preferably room temperature or more and 100° C. or less, when a plastic substrate is used.

The substrate may be heat treated using a conventional hot plate or electric furnace, or by lamp annealing. While the light source used for lamp annealing is not particularly restricted, examples of them available include IR lamp, a xenon lamp, YAG laser, argon laser, carbon dioxide laser, and eximer lasers such XeF, XeCl, XeBr, KrF, KrCl, ArF and ArCl lasers. While conventionally used light sources have an output of 10 W or more and 5000 W or less, an output of 100W or more and 1000 W or less is sufficient in the invention.

Since the conductive fine particles 3 or their aggregates 3a, and/or the decomposition product of the organometallic compound are continuously formed (or formed in contact with each other) by sintering in the conductive pattern 4 obtained by the process above, electrical contact among the particles are secured to form a conductive layer pattern with good electrical continuity.

While the fluid is discharged from the droplet discharge head 10 so that each of the droplets 22a after hitting the wiring board is in contact with adjoining droplets 22a with each other, the degree of contact, or the degree of overlapping, may be controlled so that three or more of the continuous droplets (for example five droplets) are in contact with each other with partial overlap among them, in place of only the adjoining two droplets contact (overlap) with each other. Such procedure permits substantially the same effect as the effect of repeated application to be obtained, by adjusting the degree of overlapping, or by adjusting the diameter of the droplets 22a and the distance between the droplets 22a after allowing the droplets to hit the wiring board.

The liquid component of the discharged droplets 22a promptly permeate into the receiving layer 2, and at least one of the conductive fine particles 3 and organometallic compound are mainly left behind on the receiving layer. Consequently, the aggregates 3a of at least one of the conductive fine particles 3 and organometallic compound may partially overlap with each other without forming any bulges, by discharging the droplets 22a so that they contact with each other after hitting the wiring board. Therefore, the pattern 4 may be formed with a thickness the same as the thickness obtainable by repeated application.

When the layer is required to have a particularly large thickness, the droplets 22 may be discharged on the receiving layer 2 plural times for repeated application. This process permits plural times of direct application without any drying steps between the first discharge step and second discharge step, since at least one of the conductive fine particles 3 and organometallic compound are selectively left behind on the receiving layer 2 as described above with substantially no liquid component thereon. Consequently, the conductive pattern (conductive layer pattern) 4 may be efficiently thickened.

A heat treatment step (drying step) may, alternatively, be provided between the discharge steps when the droplets 22 are discharged plural times on the receiving layer 2 for repeated application. A temperature where at least one of the fine conductive particles 3 and organometallic compound in the droplets 22 are not bonded, or sintered, with each other is used for the heat treatment step.

When the temperature where at least one of the fine conductive particles 3 and organometallic compound in the droplets 22 are not bonded, or sintered, with each other is used for the heat treatment step, the liquid component in the droplets 22 is reliably evaporated including the liquid component permeated into the receiving layer 2, and the liquid component is sufficiently removed from the aggregates 3a of at least one of the fine conductive particles 3 and organometallic compound left behind on the receiving layer 2. Since the conductive fine particles 3 in the aggregates 3a are not bonded (sintered) with each other, the fine voids are formed among the fine conductive particles 3 as among the particles in the receiving layer 2.

Accordingly, the aggregates 3a that have been previously formed function like the receiving layer 2 when the droplets 22 are discharged and repeatedly applied on the aggregates 3a comprising the fine voids. The liquid component in the droplets 22 is promptly absorbed through the aggregates into the receiving layer 2. Consequently, the thickness may be reliably increased with no incidence of bulges by providing a heat treatment step (drying step) for repeated application.

Figure 3:
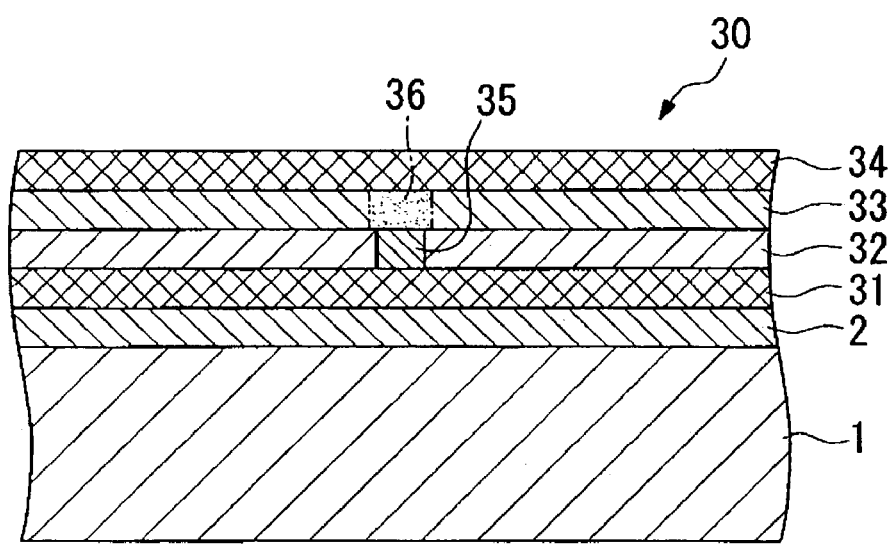
FIG. 3 is a cross section of the main part of an example when the wiring board of the invention is applied to a multilayer wiring board.

The wiring board according to the invention comprises the conductive pattern (conductive layer pattern) 4 as the wiring line. FIG. 3 shows an example of the wiring board applied to a multilayer wiring board. The reference numeral 30 in FIG. 3 denotes the multilayer wiring board. A wiring line 31 comprising the conductive pattern (conductive layer pattern) 4 is formed on the wiring board 1 with interposition of the receiving layer 2 in this multilayer substrate 30, and another insulation layer 32, receiving layer 33 and wiring line 34 are formed on the wiring line 31.

A conductive post 35 is formed on the wiring line 31 so as to be connected thereto. The insulation layer 32 does not cover the upper face of the post 35, and covers the surfaces of the receiving layer 2 and wiring line 31 while embedding the periphery of the post 35. Another receiving layer 33 having the same construction as the receiving layer 2 is formed on the surfaces of the insulation layer 32 and post 35. The wiring line 34 is formed on the receiving layer 33 by the same method as forming the conductive pattern 4.

The wiring line 34 is formed so that a part of it is positioned immediately above the post 35, in order to electrically communicate the wiring line 34 with the wiring line 31 through the post 35 formed under the wiring line 34. In other words, the droplets 22 are discharged immediately on the post 35 from the droplet discharge head 10 to form the wiring line 34. As a result, at least one of a part of the conductive fine particles 3 (having smaller diameter) and the organometallic compound in the discharged droplets 22a hitting the wiring board invade into the receiving layer 33 to from a conductive part 36. Accordingly, the wiring line 34 formed electrically communicates with the wiring line 31 through the conductive part 36 formed thereunder and the post 35.

While the conductive part 36 is defined to be on the post 35 in FIG. 3 for the convenience of explanation, all the positions just under the wiring line 34 in the receiving layer 33 serve as the conductive part.

While FIG. 3 illustrates two layer wiring lines comprising the wiring line 31 as a lower layer and the wiring line 34 as an upper layer, a multilayer wiring board comprising three or more layers may be formed by sequentially laminating additional insulation layers, posts, receiving layers and wiring lines in this order on the wiring line 34.

The electronic device of the invention has the conductive pattern (conductive layer pattern) 4. Examples of the electronic device include electrooptical devices such as various semiconductor devices, liquid crystal display, organic EL display and plasma display.

Figure 4:
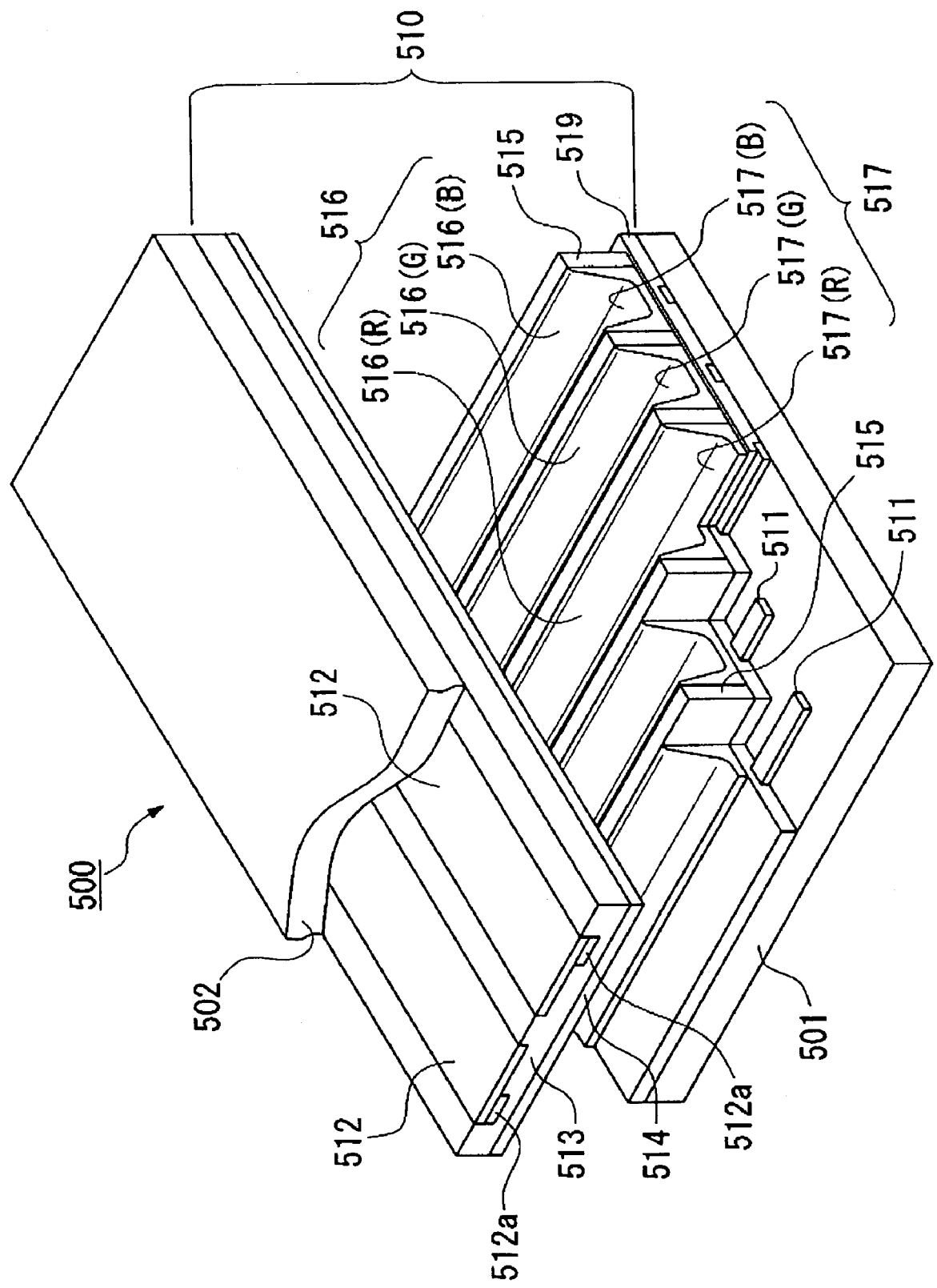
FIG. 4 is a disassembled perspective view of the main part when the electronic device of the invention is applied to a plasma display.

FIG. 4 shown an example of the electronic device of the invention applied for the plasma display. The reference numeral 500 in FIG. 4 denotes the plasma display. The plasma display 500 comprises glass boards 501 and 502 facing with each other, and a discharge display member 510 formed between the glass substrates.

The discharge display member 510 comprises a plurality of assembled discharge cells, and one pixel is formed by a combination of three discharge cells 516 of a red discharge cell 516(R), green discharge cell 516(G) and blue discharge cell 516(B) of the plural discharge cells 516.

Addressing electrodes 511 are formed on the glass substrate 501 as stripes with a given distance apart, and a dielectric layer 519 is formed so as to cover the addressing electrode 511 and glass substrate 501. Partition walls 515 are formed so as to be parallel to each addressing electrode 511 and to position between the addressing electrodes 511 on the dielectric layer 519. The partition wall 515 is divided with a given distance in the direction perpendicular to the addressing electrode 511 at prescribed positions in the longitudinal direction (not shown). Basically, a rectangular region, which is divided by the adjoining partition walls at right and left sides in the direction of the width of the electrode 511 and by the partition walls extending in the direction perpendicular to the addressing electrode, is formed to form a discharge cell 516 corresponding to this rectangular region. One pixel is formed by a combination of these three rectangular regions. A fluorescent substance 517 is disposed within the rectangular region divided by the partition walls 515. The fluorescent substance 517 emits either red, green or blue color, and a red fluorescent substance 517(R), green fluorescent substance 517(G) and blue fluorescent substance 517(B) are disposed at the bottoms of the red discharge cell 516(R), green discharge cell 516(G) and blue discharge cell 516(B), respectively.

A plurality of transparent display electrodes 512 comprising ITO are formed at the glass substrate 502 side as stripes with a given distance in the direction perpendicular to the addressing electrode 511, and bus-electrodes 512a comprising a metal are formed for compensating the high resistance ITO electrode. A dielectric layer 513 is formed so as to cover these electrodes, and a protective layer 514 comprising MgO is further formed under the dielectric layer.

The substrates 2, or the substrate 501 and glass substrate 502, are bonded to face with each other so that the addressing electrode 511 is perpendicular to the display electrode 512, and the discharge cell 516 is formed by sealing a rare gas after evacuating the space surrounded by the substrate 501, division walls 515 and protective layer 514 formed at the glass substrate 502 side. Two display electrodes 512 formed at the glass substrate 502 side are disposed at each discharge cell 516.

The addressing electrode 511 and display electrode 512 are connected to an alternating current source (not shown), the fluorescent substance 517 is excited at the discharge display member 510 at a required position by flowing a current to each electrode, and the fluorescent substance emits a light to enable color display.

In particular, the addressing electrode 511 and bus electrode 512a are formed with the conductive pattern (conductive layer pattern) 4 of the invention in this example. While the receiving layer (not shown) is formed between the bus electrode 512a and display electrode 512 in this example, the portion under the bus electrode 512a becomes conductive, although it has rather high resistance, by sintering at least one of the conductive fine particles and organometallic compound permeated into the receiving layer. Accordingly, electrical continuity between the display electrode 512 and bus electrode 512a is maintained.

Accordingly, the plasma display of the invention can be manufactured with good productivity by efficiently thickening the conductive pattern (conductive layer pattern) 4.

Figure 5:
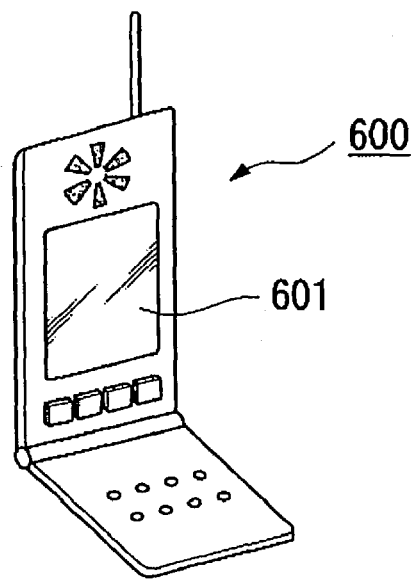
Figure 5:
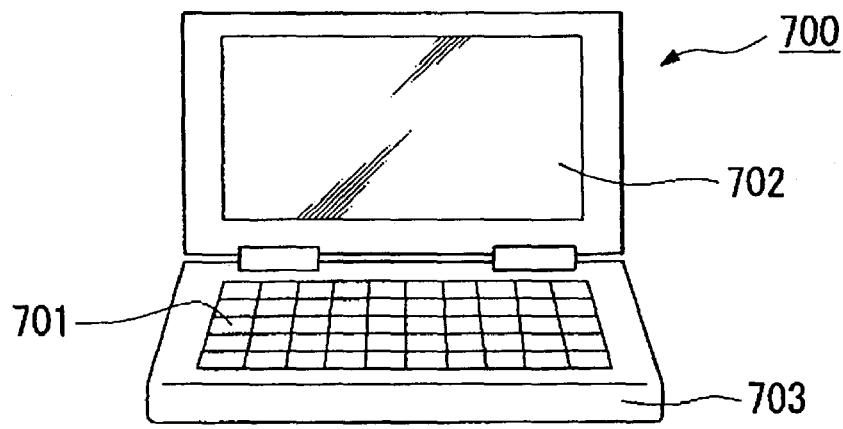
Figure 5:
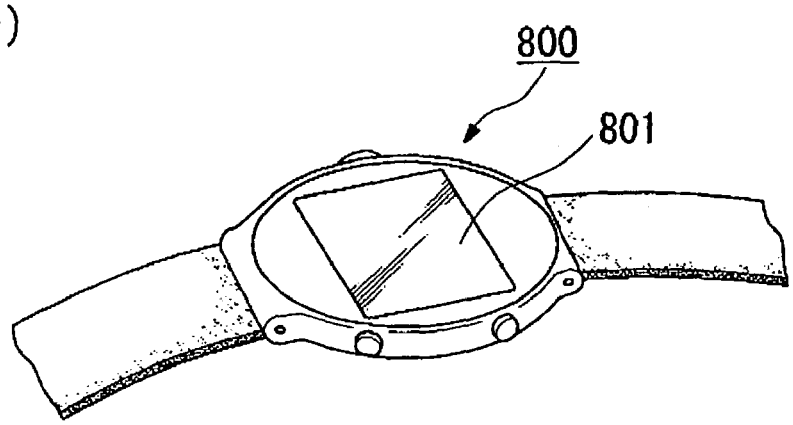

In another example, the electronic appliance as shown in FIG. 5 has the conductive pattern (conductive layer pattern) 4.

FIG. 5(a) is a perspective view showing an example of the portable phone. In FIG. 5(a), the reference numeral 600 denotes the main unit of the portable phone, and the reference numeral 601 denotes a display comprising the conductive pattern (conductive layer pattern) 4.

FIG. 5(b) is a perspective view showing an example of a portable information processor such as a word processor and personal computer. In FIG. 5(b), the reference numeral 700 denotes an information processor, the reference numeral 701 denotes an input device such as a keyboard, the reference numeral 703 denotes a main unit of the information processor, and the reference numeral 702 denotes a display having the conductive pattern (conductive layer pattern) 4.

FIG. 5(c) is a perspective view of an example of a watch type electronic appliance. In FIG. 5(c), the reference numeral 800 denotes the main unit of the watch, and the reference numeral 801 denotes a display having the conductive pattern (conductive layer pattern) 4.

Since the electronic appliances in FIGS. 5(a) to 5(c) comprises the conductive pattern (conductive layer pattern) 4, they have high productivity.

Figure 6:
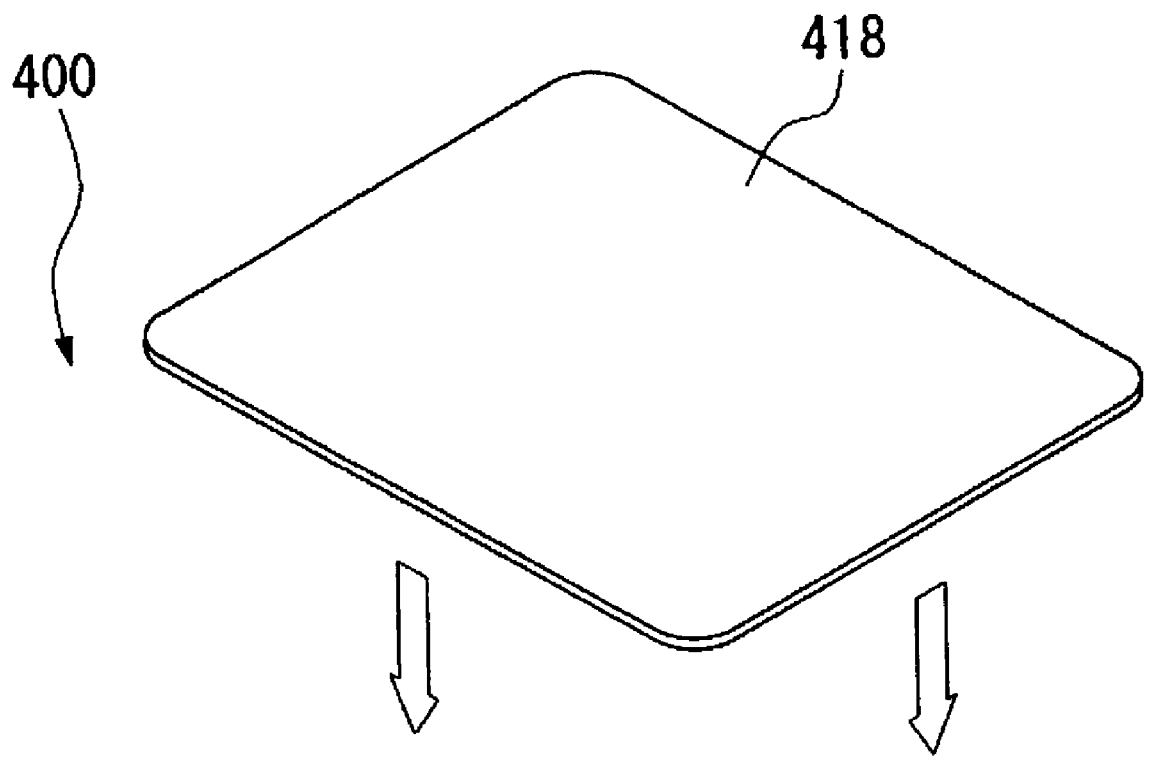
FIG. 6 is a disassembled perspective view of a noncontact card medium of the invention.
Figure 6:
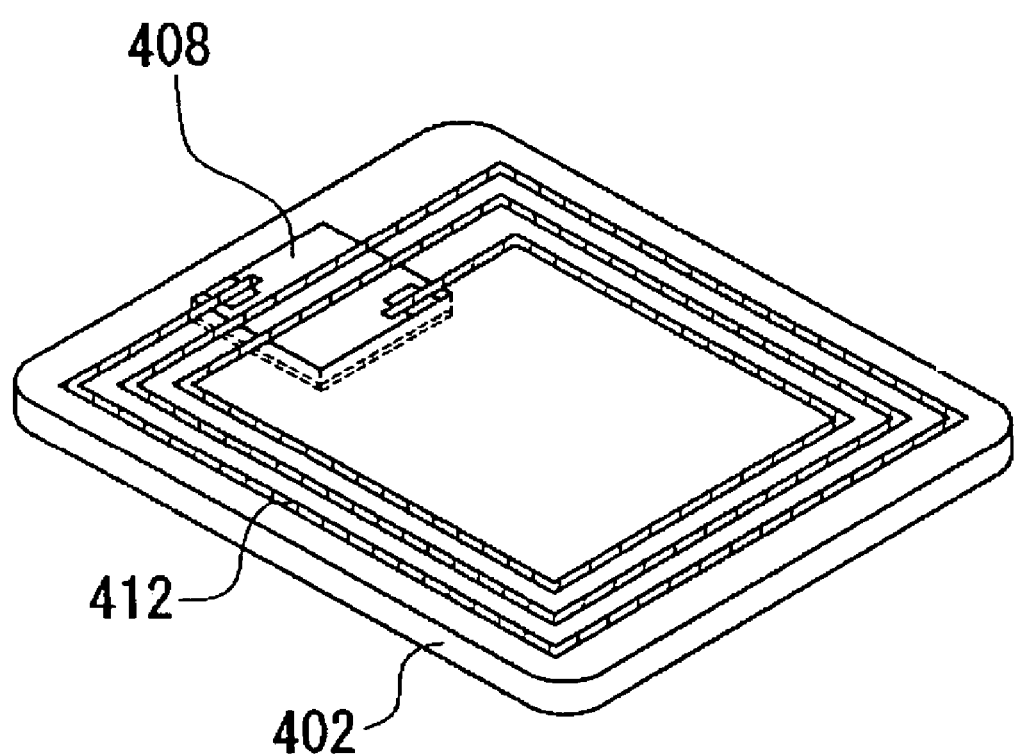

The noncontact card medium of the invention comprises the conductive pattern (conductive layer pattern) 4 as an antenna circuit. FIG. 6 shows an example of the noncontact card medium shown by the reference numeral 400 in the drawing. The noncontact card medium comprises an integrated semiconductor circuit chip 408 and an antenna circuit 412 integrated into a housing comprising a card substrate 402 and card cover 418, and performs at least one of electric power supply and data transfer/reception by at least one of electromagnetic coupling and static coupling with an auxiliary transmitter/receiver.

The antenna circuit 412 comprises the conductive pattern (conductive layer pattern) 4 of the invention in this example.

According to the noncontact card medium 400 in this example, troubles such as break and short circuit of the antenna circuit 412 hardly occurs while making the noncontact card medium small size and thin. In addition, productivity of the card medium is high since the conductive pattern (conductive layer pattern) 4 is efficiently thickened.

EXAMPLE 1

The conductive layer pattern was formed as follows based on the method shown in FIGS. 1(a) to 1(d).

A polyimide substrate was prepared as the wiring board 1, and the receiving layer 2 was formed thereon as follows.

Prepared was a mixture comprising 1 part by weight of spherical silica particles having s mean particle diameter of 15 μm, mean fine pore diameter of 150 Å and fine pore volume of 1.6 cc/g, 25 parts by weight of alumina sol (pseudo-boehmite AS-3 made by Catalyst & Chemicals Ind. Co.), and 10 parts by weight of 10% aqueous solution of polyvinyl alcohol (PVA 117 made by Kurarey Co.). Then, the mixture was applied on the wiring board 1 with a bar coater, and the receiving layer 2 was obtained by drying at 125° C. for 1 minute.

The fluid for discharging with the droplet discharge apparatus was prepared as follows.

A dispersion of gold fine particles (trade name "perfect gold" made by Vacuum Metallurgical Co.) with a diameter of about 10 nm in toluene was diluted by adding toluene to adjust the viscosity at 3 mPa·s, and the dispersion was used as the fluid.

A head of a commercially available printer (trade name PM 950c) was used as the droplet discharge head for discharging the fluid. However, since the ink suction part was made of a plastic, the suction part was replaced with a metallic part so that it is not dissolved in an organic solvent.

The droplet discharge head was driven at a driving voltage of 20 V to discharge the fluid. The volume of one droplet 22 discharged was 4 picoliter, and the diameter of the droplet 22a after hitting the wiring board was about 25 μm. The dispersing medium of the droplets 22a after hitting the wiring board was promptly absorbed by the receiving layer 2, and a fine particle accumulation layer (the aggregate 3a of the fine particles) with a diameter of 25 μm and thickness of 2 μm was formed.

The discharge interval of the droplet 22 was every 5 μm under the discharge conditions as described above, and the droplets were patterned in a line. Since the diameter of one droplet hitting the wiring board is 25 μm, the adjoining droplets overlap 20 μm with each other. Five droplets partially overlap in one droplet region, and the same result as the result when the droplets are discharged under a condition in which the droplets do not overlap with each other (discharge with a space of 15 μm) and are repeatedly applied five times with drying steps between every discharge step, or a thickness of 5 μm, could be obtained by one scanning of the head.

The substrate was heated at 300° C. for 30 minutes thereafter. As a result, most of polyvinyl alcohol as a binder component of the receiving layer 2 was decomposed, and the thickness of the receiving layer was reduced half of the thickness before the heat treatment. The portion of the receiving layer 2 where no conductive fine particles are present just above the receiving layer became a good insulation layer by allowing silica and alumina fine particles to tightly bond with each other. On the other hand, the portion of the receiving layer where the conductive fine particles are present just above the receiving layer became to be electrically conductive, although it has relatively high resistance, since the conductive fine particles permeated so as to fill the fine voids in the receiving layer 2 had been sintered while decomposing the binder component. In other word, the portion where the conductive fine particles have permeated functions as a conductive portion by allowing the conductive fine particles to permeate so as to fill the fine voids in the receiving layer 2 to function as another binder.

The conductive fine particles left behind on the receiving layer 2 are sintered by the same manner as if they were sintered on a conventional substrate, and were converted into a low resistance conductive pattern (conductive layer pattern) 4. Since the conductive pattern 4 formed as described above is continuously formed in electrical continuity with the conductive portion in the receiving layer 2, the pattern was bonded to the receiving layer (conductive part) with a sufficiently high adhesive force. The adhesive force between the receiving layer 2 and wiring board 1 was also strong since the binder component in the receiving layer 2 was tightly adhered.

Consequently, the portion from the substrate to half of the thickness of the receiving layer before heating was converted into the high resistance conductive part, and a pattern of the low resistance conductive pattern could be formed thereon with a thickness of about 2.5 μm.

EXAMPLE 2

Into a dispersion of gold fine particles (a liquid prepared by diluting "perfect gold (trade name)" made by Vacuum Metallurgical Co. with toluene to a viscosity of 3 mPa·s) used in Example 1, 10% by weight of chlorotrimethyl phosphine gold (I) as an organometallic compound was added and dissolved. A conductive pattern was prepared by the same process as in Example 1, except that the fluid obtained as described above was used.

Since chlorotrimethyl phosphine gold (I) is dissolved in toluene, it is readily absorbed into the receiving layer together with toluene as a solvent, it is decomposed by baking at 300° C. to precipitate gold. Consequently, the receiving layer under the position where droplets are disposed was converted into a conductive part. This part had a lower resistance than the part prepared by allowing only the conductive particles to permeate in Example 1.

EXAMPLE 3

After discharging a fluid onto the substrate from the droplet discharge head by the same method as in Example 1, the substrate was heat treated at a temperature of 100° C. in place of heating at 300° C. for 30 minutes. This treatment was applied for removing the dispersing medium in the droplets, and the conductive fine particles are not bonded (sintered) with each other at this temperature.

The droplets were discharged again by the same method as in Example 1 for repeated application on the lines comprising the conductive fine particles obtained by the heat treatment. Then, since the layer (aggregates) comprising the conductive fine particles that has been formed serves as a receiving layer, the thickness of the layer was doubled (10 μm) with the same pattern.

The particles were applied several times and the layer formed was finally baked (sintered), and a conductive layer pattern having a thickness approximately proportional to the repeated number of application could be formed.

EXAMPLE 4

A multilayer wiring board was prepared by the method for forming the conductive pattern in Examples 1 and 3.

A post pattern was formed so as to be continuous to a part of the line that had been formed as a repeatedly applied pattern in Example 3. Then, the pattern was baked at a high temperature to form the conductive pattern and a post connected thereto.

Subsequently, polyimide was applied so as to cover the receiving layer and the conductive pattern thereon while allowing the surface of the post to be exposed. An inter-insulation layer was formed by curing the polyimide layer. Polyimide was applied using a solution of a polyimide precursor and the same droplet discharge apparatus as used for discharging the solution containing the conductive fine particles. The pattern was applied so as to detour around the post.

A receiving layer was formed again in the inter-insulation layer by the same method as in Example 1, and a second conductive pattern was formed thereon by the same method as in Example 1. When the second conductive pattern is formed as described above, the conductive fine particles in the discharged droplets (fluid) are permeated into the fine voids in the second receiving layer. A conductive part is formed on the surface of the inter-insulation layer comprising polyimide so as to reach the surface of the post by filling the voids with the conductive particles. A second layer may be applied after a drying step, if necessary.

After forming the second layer of the conductive pattern as described above, the layer was baked at a high temperature, for example heated at 300° C. for 30 minutes. Then, the first layer of the wiring pattern (conductive pattern) electrically communicates with the second wiring pattern (conductive pattern) through the conductive part in the receiving layer and through the post. The other regions are insulated.

Another post, inter insulation layer and receiving layer, and a pattern of the discharged fluid were formed on the second pattern, and the multilayer wiring board was completed by repeating the process above.

EXAMPLE 5

A multilayer wiring board similar to that in Example 4 was manufactured as follows.

Figure 7:
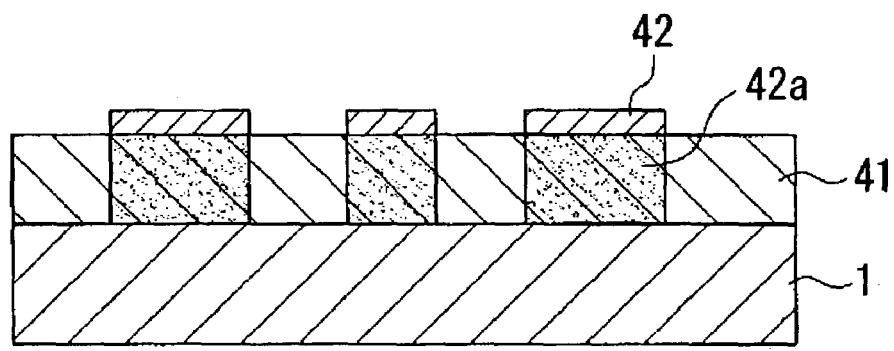
FIGS. 7(a) to 7(c) are cross sections of the main part of the wiring board of the invention for sequentially describing the method for manufacturing a multilayer wiring board as an application of the wiring board of the invention.
Figure 7:
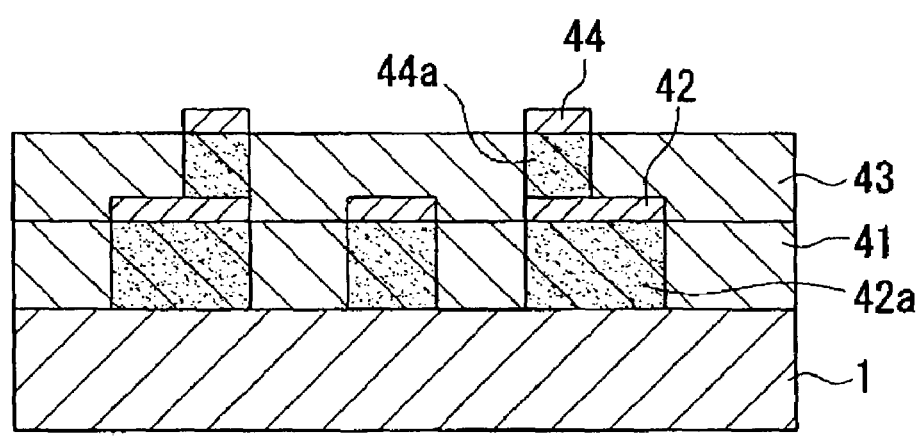
Figure 7:
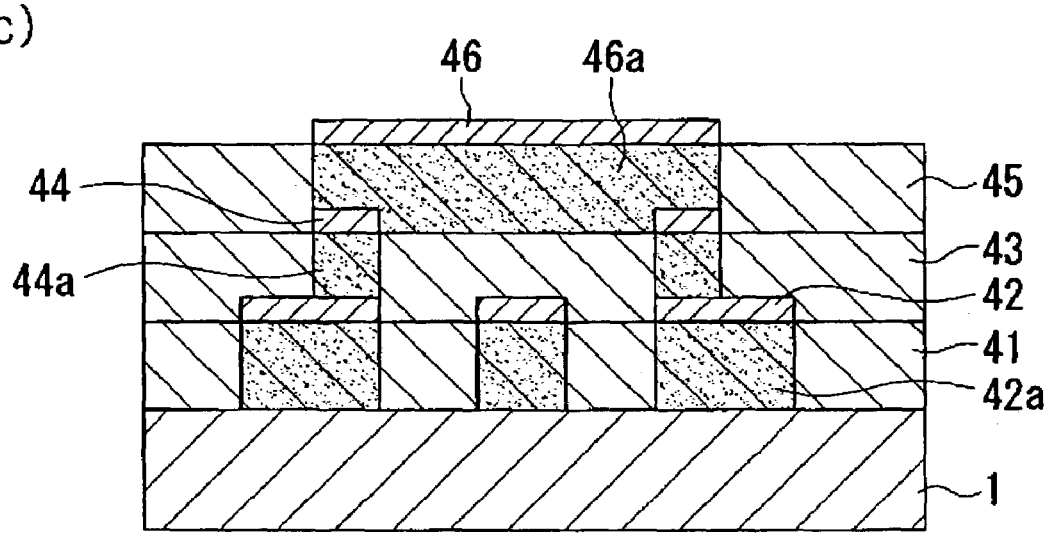

Using the same method as in Example 2, a first conductive layer pattern 42 was formed on a receiving layer 4 as shown in FIG. 7(*a*). Since the receiving layer 41 had been heat treated at 300° C., the fluid is not absorbed even by disposing a fluid (liquid) thereon, and the receiving layer merely maintains a function as an insulator. The portion of the receiving layer 41 where the conductive layer pattern 42 has been formed just above the portion is converted into a conductive part 42*a* having rather high resistance by sintering of the conductive fine particles permeated into the receiving layer 41 and by heat decomposition of the organometallic compound permeated into the receiving layer 41.

Subsequently, a portion corresponding to the conductive post in Example 3 was formed as follows.

A receiving layer 43 was formed on the entire surface of the receiving layer 42 as shown in FIG. 7(*b*) by the same method as in Example 2, and a conductive layer pattern 44 was formed at a portion for electrically communicating between the upper layer and lower layer (the portion corresponding to the post in Example 3). Since the layer had been also baked at 300° C., the receiving layer 43 under the conductive pattern 44 is converted into a conductive part 44*a* having rather high resistance by sintering of the conductive particles permeated into the receiving layer 43 and by heat decomposition of the organometallic compound permeated into the receiving layer 43. This layer is electrically connected to the conductive pattern 42 under it. Accordingly, a conductive post for permitting the upper and lower wiring lines to electrically communicate is formed by the conductive pattern 44 and conductive part 44*a*. The portion of the receiving layer 43 where no conductive pattern is formed loses the function as the receiving layer, and only serves as an insulation layer.

The portions corresponding to the conductive post and inter-insulation layer in Example 3 were simultaneously formed by the process above.

Subsequently, another receiving layer 45 was formed again on the entire surface of the receiving layer 43 by the same method as in Example 0.2, and a second conductive layer pattern 46 was formed as shown in FIG. 7(*c*). Since the layer has been also baked at 300° C., the receiving layer 45 under the conductive layer pattern 46 serves as a conductive part 46*a* having rather high resistance, and the layer is electrically connected to the conductive pattern 44 and conductive part 44*a* that serve as a post for electrical communication between the upper and lower layers.

The first conductive layer pattern 42 and second conductive layer pattern 46 are electrically communicating with each other through the high resistance conductive part 44*a* in the receiving layer and conductive layer pattern 44, as well as through the conductive part. 46*a*, and are electrically insulated at the other portions.

A receiving layer was formed on the second pattern layer by the same method as forming the first layer, followed by forming a conductive layer pattern as a post for electrical communication. The multilayer wiring board was completed by repeating the processes for forming a third pattern layer and thereafter.

According to the method for forming the conductive layer pattern of the invention described above, a fluid containing conductive fine particles is provided on the receiving layer. The liquid component of the fluid permeates into the receiving layer, and the conductive fine particles are mainly left behind on the receiving layer. Consequently, repeated application is possible without any drying treatment to enable the layer to be efficiently thickened.

Accordingly, the wiring board of the invention can be produced with high productivity by improving the method for forming the conductive layer pattern, and by more efficiently thickening the layer.

Japanese Patent Application Nos. 2002-112060 filed Apr. 15, 2002 and 2002-238390 filed Aug. 19, 2002, are hereby incorporated by reference.

What is claimed is:

1. A method of forming a wiring substrate, the method comprising:
    forming a first film over a substrate, the first film being made from a plurality of first particles;
    forming a single molecular layer of fluoroalkyl silane on at least a portion of a surface of the first film, the forming of the single molecular layer including irradiating the first film with a light and heating the first film in an atmosphere including a precursor of fluoroalkyl silane; then
    forming a second film on the layer, the second film being made from a plurality of conductive particles.

2. The method of forming a wiring substrate according to claim 1, the forming of the single molecular layer including irradiating a light to a surface of the first film and heating the first film in an atmosphere that includes perfluoro-1,1,2,2-tetrahydrodecyltriethoxysilane.

3. The method of forming a wiring substance according to claim 1, the plurality of first particles including a plurality of silica particles.

4. The method of forming a wiring substrate according to claim 1, the plurality of first particles include a plurality of aluminum oxide particles.

5. The method of forming a wiring substrate according to claim 1, the plurality of first particles including a plurality of titan oxide particles.

6. The method of forming a wiring substrate according to claim 1, each of the plurality of second particles being a metal particle.

7. The method of forming a wiring substrate according to claim 1, the first film and the second film being overlapped with each other.

8. The method of forming a wiring substrate according to claim 1, the first film being a porous film that has a plurality of fine voids.

9. The method of forming a wiring substrate according to claim 1, the method further comprising:
    heating the second film to form a conductive wiring, the conductive wiring including the plurality of second particles that are bonding to each other.

10. The method of forming a wiring substrate according to claim 1, a first portion of the first film on which the second film is formed, having a conductivity, and a second portion of the first film on which the second film is not formed, being an insulating film.

11. The method of forming a wiring substrate according to claim 1, wherein the forming of the first film includes applying a first liquid material to the substrate, the first liquid material including the plurality of first particles.

12. The method of forming a wiring substrate according to claim 11, the first liquid material being applied to the substrate from a nozzle of an inkjet apparatus.

13. The method of forming a wiring substrate according to claim 1, the forming of a second film including applying a second liquid material to the single molecular layer, the single molecular layer having a liquid repellent property against the second liquid material.

14. A method of forming a wiring substrate, the method comprising:

forming a first film over a substrate, the first film being made from a plurality of first particles;

forming a single molecular layer of fluoroalkyl silane on at least a portion of a surface of the first film by irradiating the first film with a light then heating the first film in an atmosphere including a precursor of fluoroalkyl silane; and forming a second film over the first film after the forming the single molecular layer, the second film being made from a plurality of conductive particles.

15. A method of forming a wiring substrate, the method comprising:

forming a first film over a substrate, the first film being made from a plurality of first particles;

forming a single molecular layer of fluoroalkyl silane on at least a portion of a surface of the first film by irradiating the first film with a light then heating the first film in an atmosphere that includes perfluoro-1,1,2,2-tetrahydrodecyltriethoxysilane; and forming a second film over the first film after forming the single molecular layer, the second film being made from a plurality of conductive particles.

* * * * *